(12) United States Patent
Kanakamedala et al.

(10) Patent No.: US 9,305,932 B2
(45) Date of Patent: Apr. 5, 2016

(54) METHODS OF MAKING THREE DIMENSIONAL NAND DEVICES

(71) Applicant: SanDisk Technologies, Inc., Plano, TX (US)

(72) Inventors: Senaka Krishna Kanakamedala, Milpitas, CA (US); Yanli Zhang, San Jose, CA (US); Raghuveer S. Makala, Campbell, CA (US); Yao-Sheng Lee, Tampa, FL (US); Johann Alsmeier, San Jose, CA (US); George Matamis, Danville, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 114 days.

(21) Appl. No.: 14/319,283

(22) Filed: Jun. 30, 2014

(65) Prior Publication Data

US 2015/0380423 A1 Dec. 31, 2015

(51) Int. Cl.
*H01L 21/225* (2006.01)
*H01L 29/76* (2006.01)
(Continued)

(52) U.S. Cl.
CPC ...... *H01L 27/11556* (2013.01); *H01L 21/0217* (2013.01); *H01L 21/02164* (2013.01); *H01L 21/02271* (2013.01); *H01L 21/02274* (2013.01); *H01L 21/28273* (2013.01); *H01L 21/31111* (2013.01); *H01L 21/32133* (2013.01);
(Continued)

(58) Field of Classification Search
CPC ............... H01L 2924/0002; H01L 27/11582; H01L 2924/00; H01L 27/11556; H01L 27/11578; H01L 27/0688
USPC ........... 257/2, 5, 314, E21.209, 324; 438/382
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |

(Continued)

FOREIGN PATENT DOCUMENTS

WO WO02/15277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — David Vu
*Assistant Examiner* — Jonathan Han
(74) *Attorney, Agent, or Firm* — The Marbury Law Group PLLC

(57) ABSTRACT

A method of making a monolithic three dimensional NAND string includes providing a first stack of alternating first material layers and second material layers over a major surface of a substrate. The first material layers include first silicon oxide layers, the second material layers include second silicon oxide layers, and the first silicon oxide layers have a different etch rate from the second silicon oxide when exposed to the same etching medium. The first stack includes a back side opening, a front side opening, and at least a portion of a floating gate layer, a tunnel dielectric and a semiconductor channel located in the front side opening. The method also includes selectively removing the first material layers through the back side opening to form back side control gate recesses between adjacent second material layers.

24 Claims, 10 Drawing Sheets

(51) Int. Cl.

| | | |
|---|---|---|
| H01L 27/115 | (2006.01) | |
| H01L 21/02 | (2006.01) | |
| H01L 21/28 | (2006.01) | |
| H01L 21/311 | (2006.01) | |
| H01L 29/49 | (2006.01) | |
| H01L 21/3213 | (2006.01) | |

(52) U.S. Cl.
CPC .... *H01L27/11519* (2013.01); *H01L 27/11524* (2013.01); *H01L 27/11526* (2013.01); *H01L 29/4916* (2013.01)

(56) References Cited

U.S. PATENT DOCUMENTS

| | | |
|---|---|---|
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,378,353 B2 | 5/2008 | Lee et al. |
| 7,514,321 B2 | 4/2009 | Mokhlesi et al. |
| 7,575,973 B2 | 8/2009 | Mokhlesi et al. |
| 7,608,195 B2 | 10/2009 | Wilson |
| 7,648,872 B2 | 1/2010 | Benson |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 2006/0102586 A1 | 5/2006 | Lee et al. |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1* | 5/2010 | Park .................. H01L 27/11578 438/287 |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0256247 A1* | 10/2012 | Alsmeier .............. H01L 21/764 257/319 |
| 2013/0056820 A1* | 3/2013 | Jeong .................. H01L 27/0688 257/324 |
| 2013/0122712 A1 | 5/2013 | Kim et al. |
| 2013/0224960 A1 | 8/2013 | Payyapilly et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0061574 A1* | 3/2014 | Pio .......................... H01L 27/10 257/5 |
| 2014/0225181 A1* | 8/2014 | Makala ............... H01L 29/7889 257/321 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Y.S. Kim et al., "Direct Copper Electroless Deposition on a Tungsten Barrier Layer for Ultralarge Scale Integration," Journal of the Electrochemical Society, vol. 152 (2) 2005.
Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.
K. R. Williams et al., "Etch Rates for Micromachining Processing," Journal of Microelectromechanical Systems, vol. 5, No. 4, Dec. 1996.
K. R. Williams et al., "Etch Rates for Micromachining Processing Part II," Journal of the Microelectromechanical Systems, vol. 12, No. 6, Dec. 2003.
M. Claes et al., "Selective Wet Etching of Hf-based Layers," Abstracts, 204th Meeting of the Electrochemical Society, 2003.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.

* cited by examiner

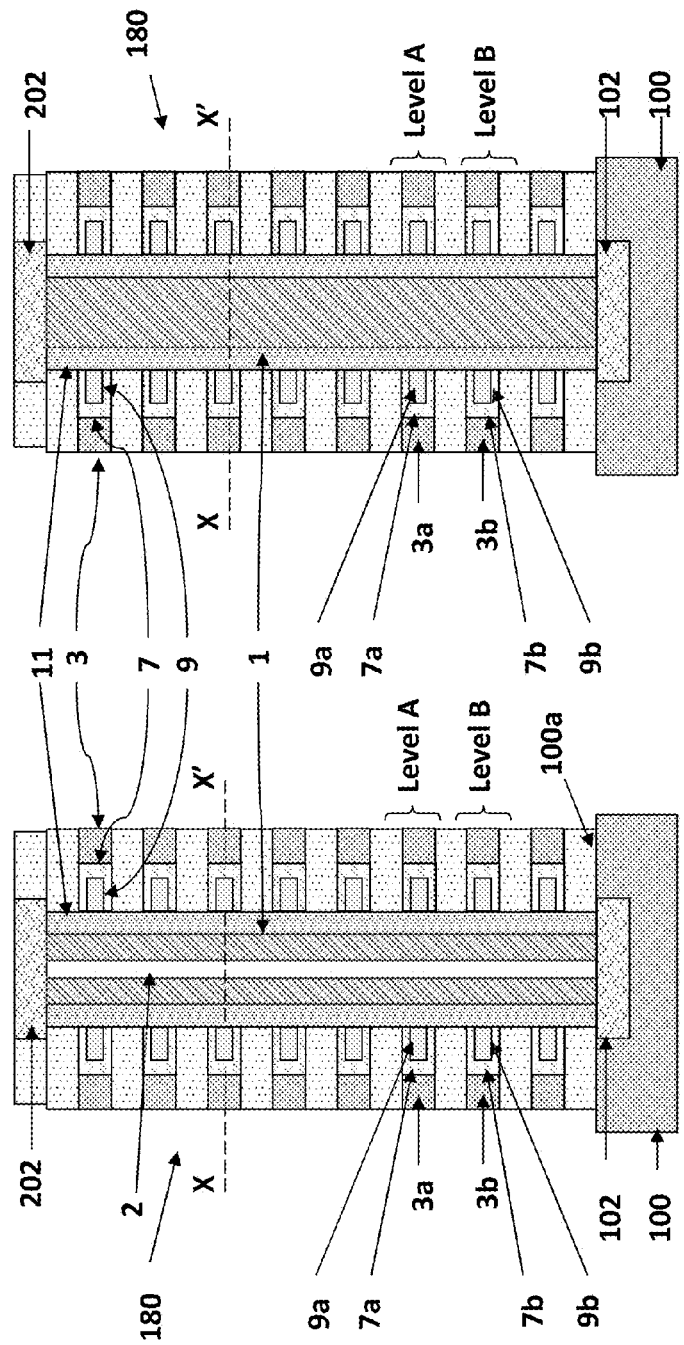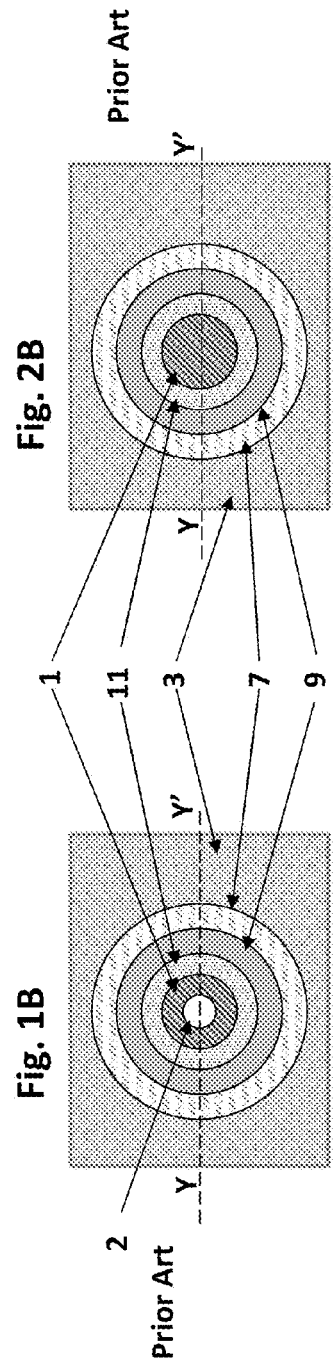

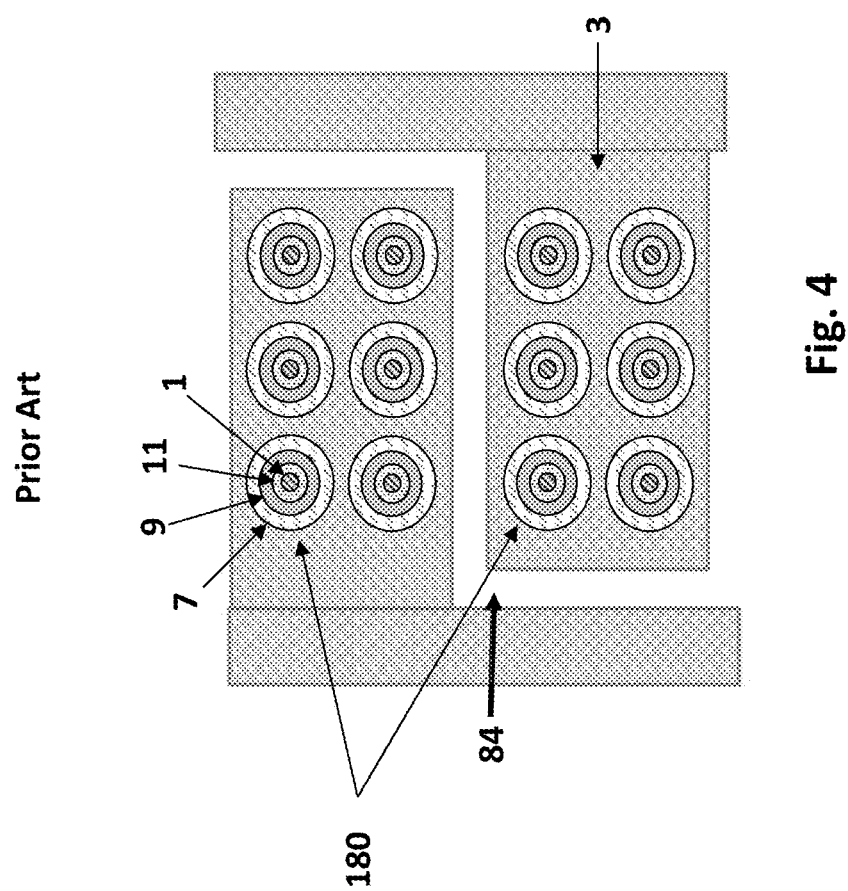

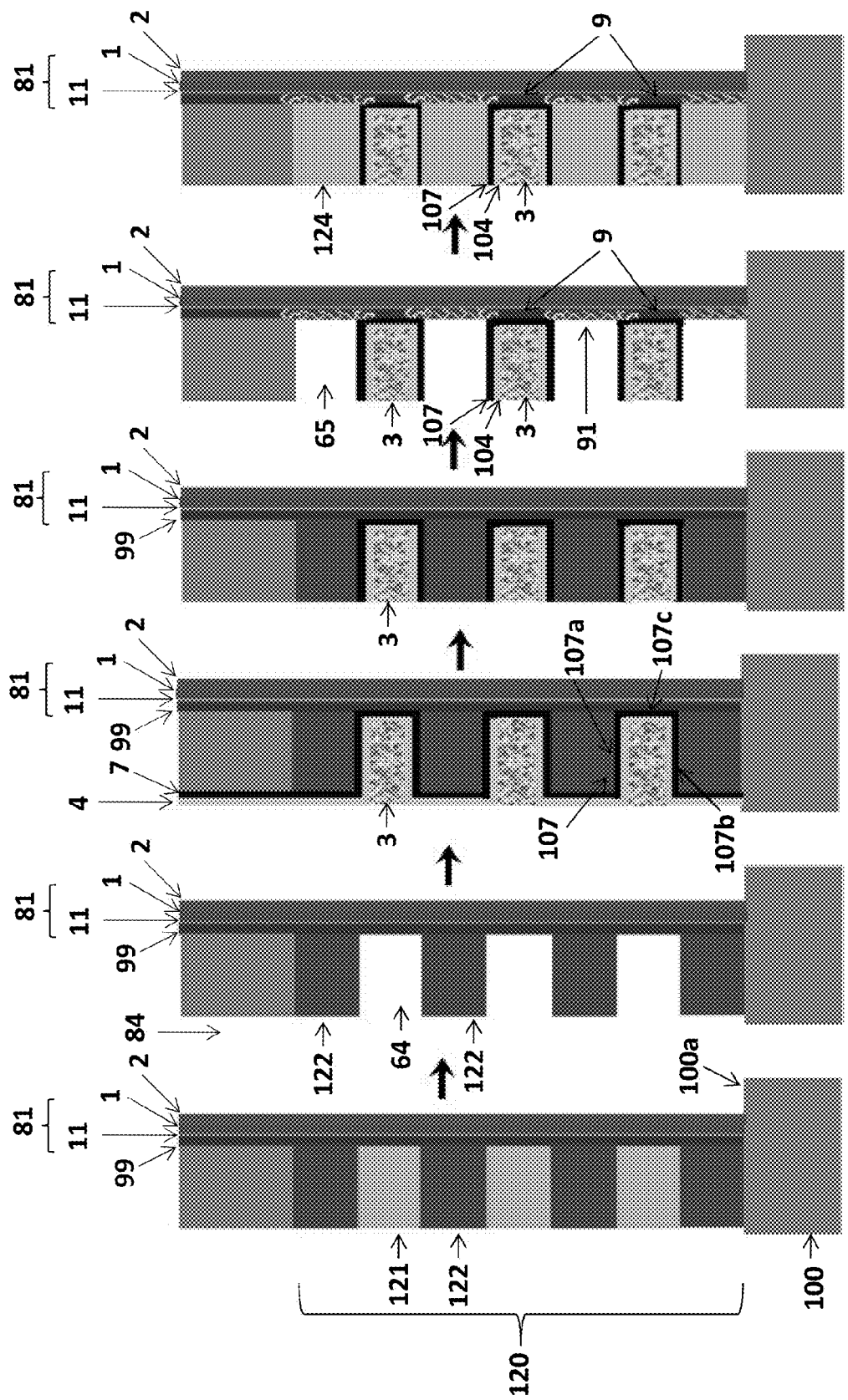

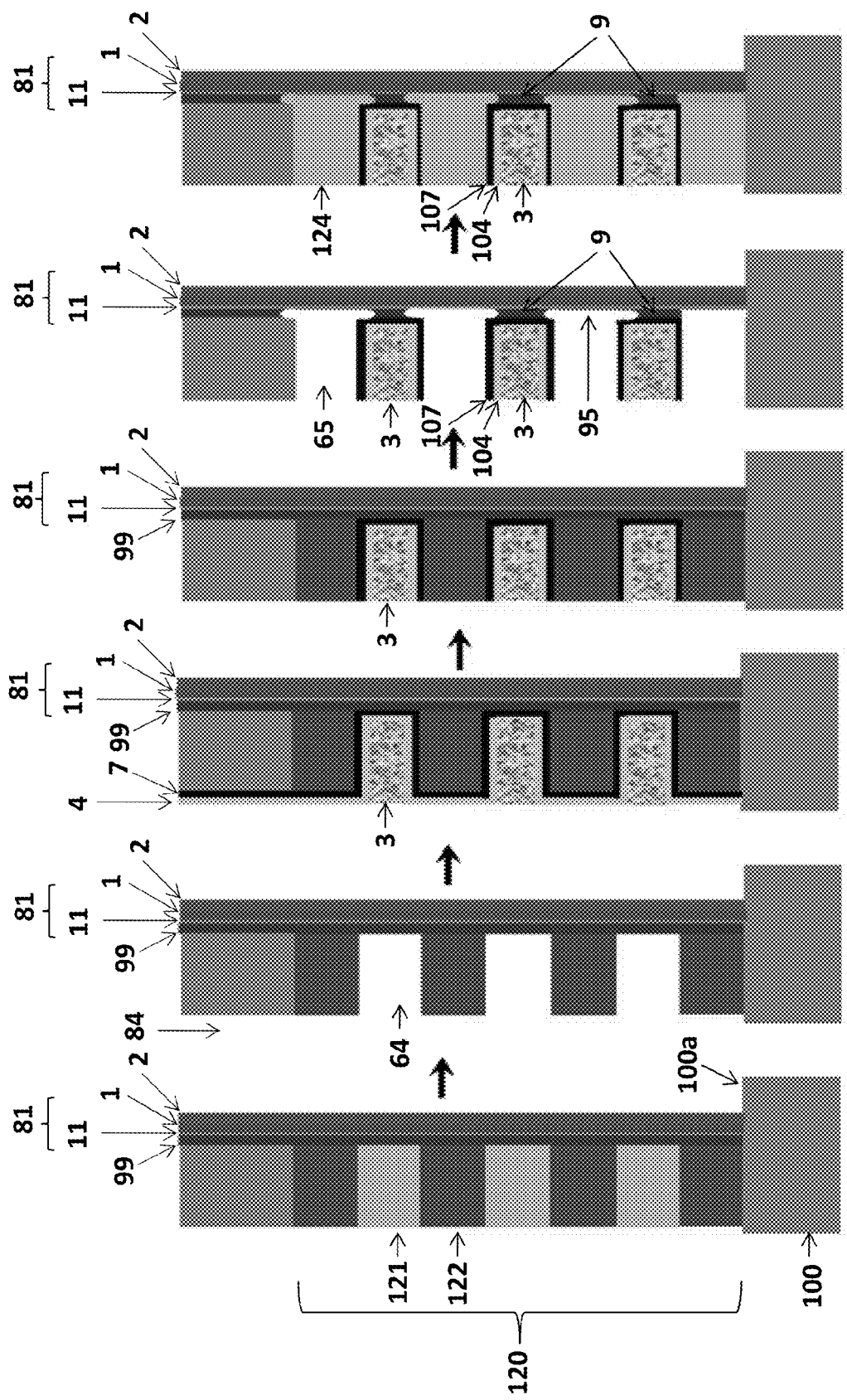

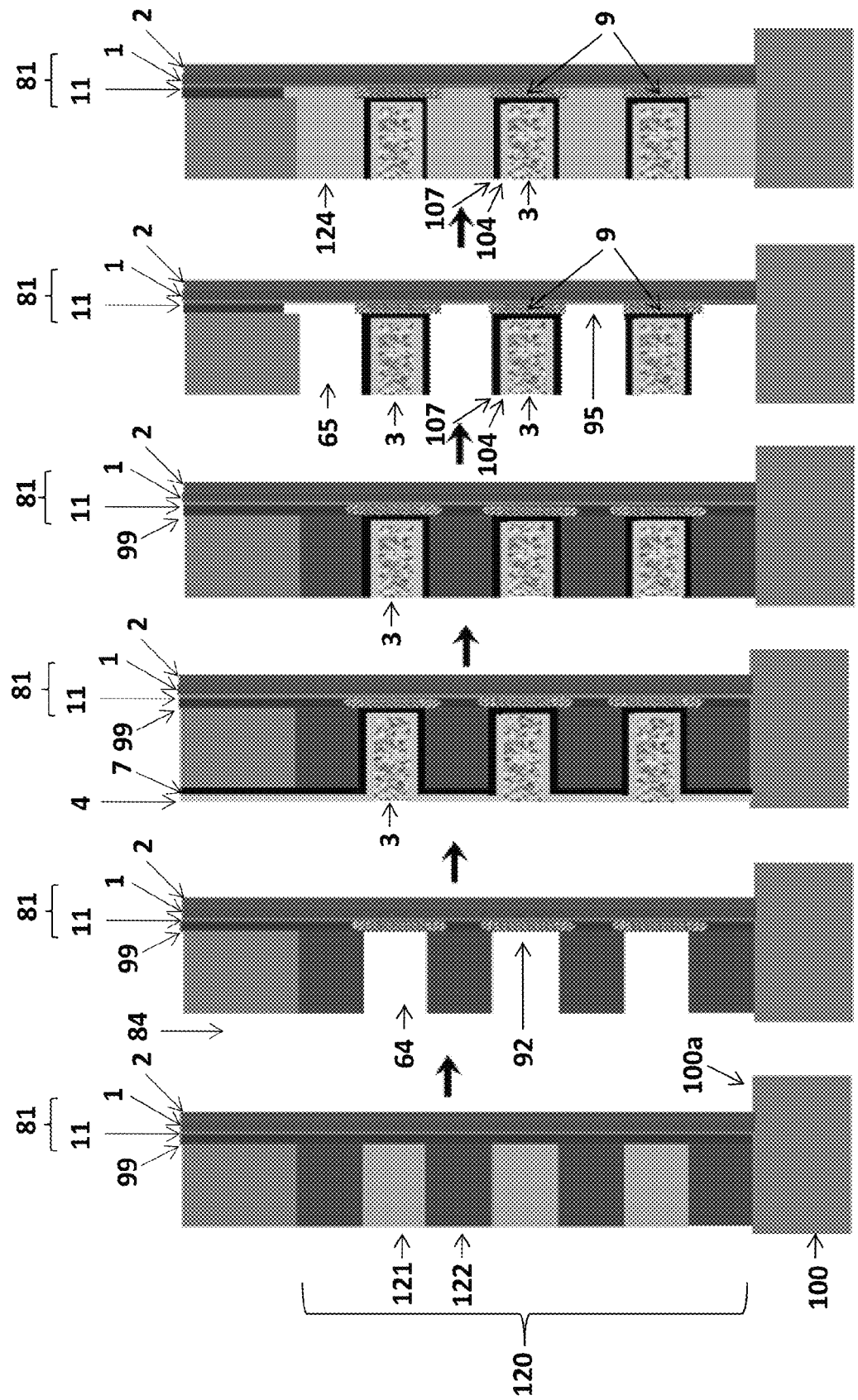

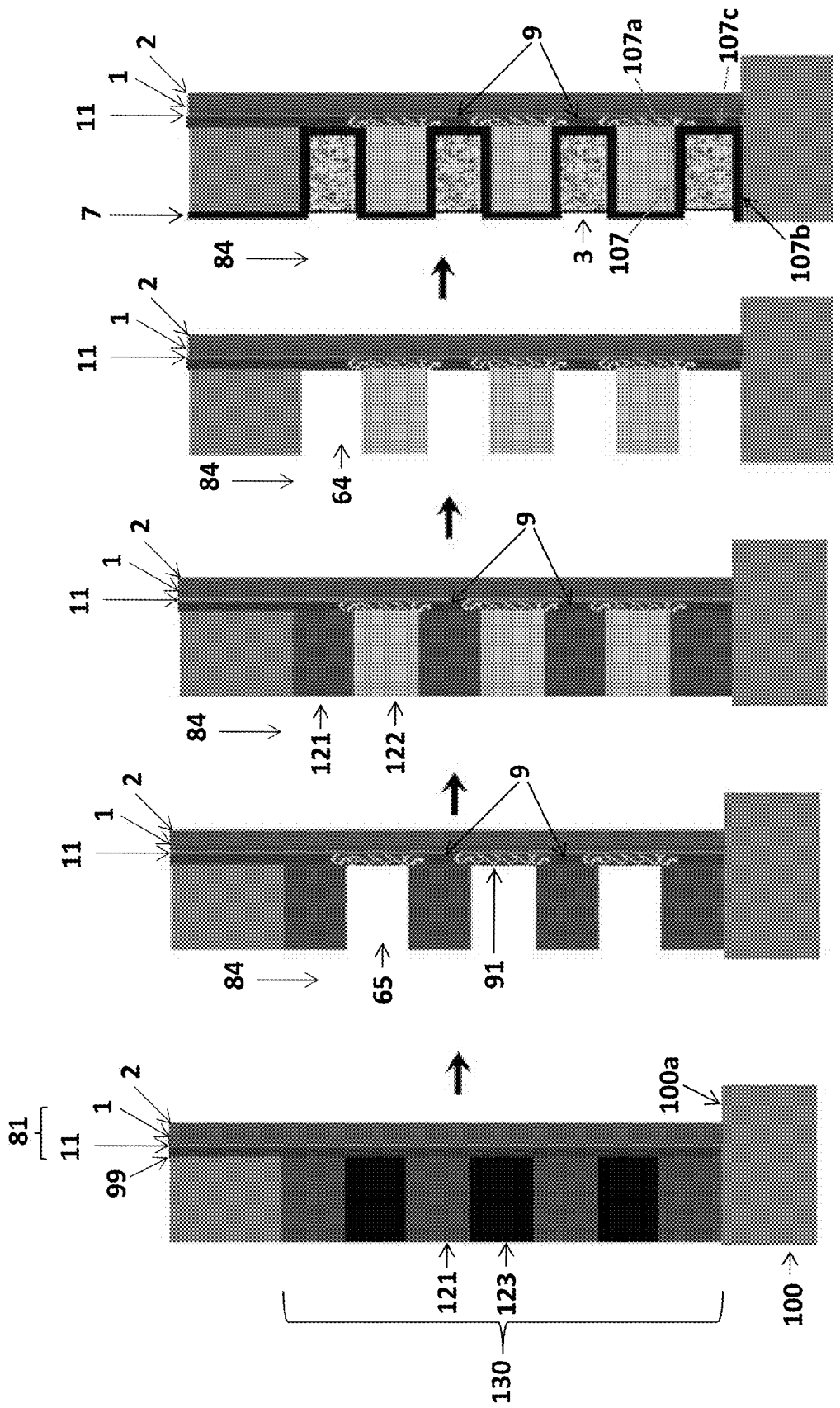

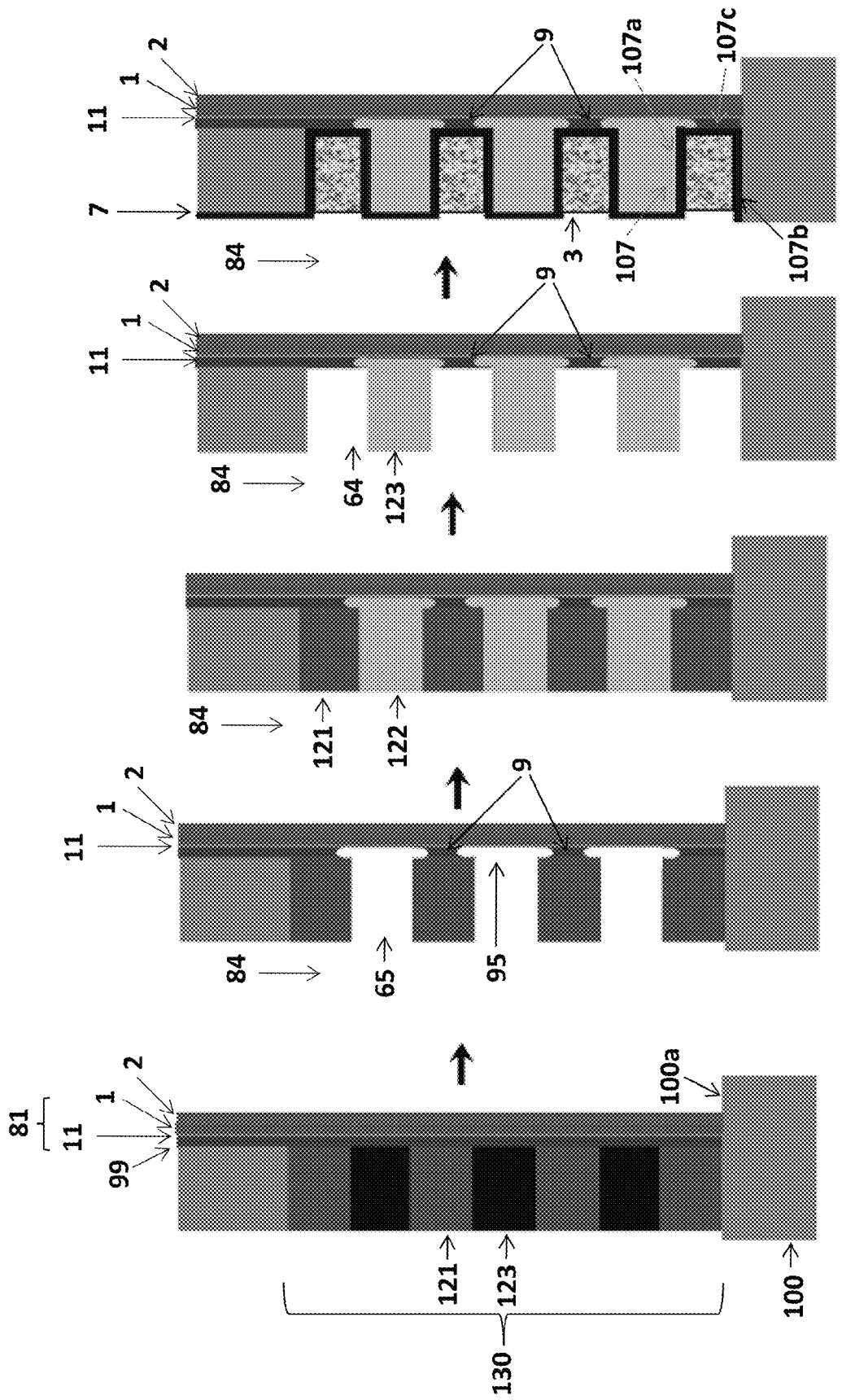

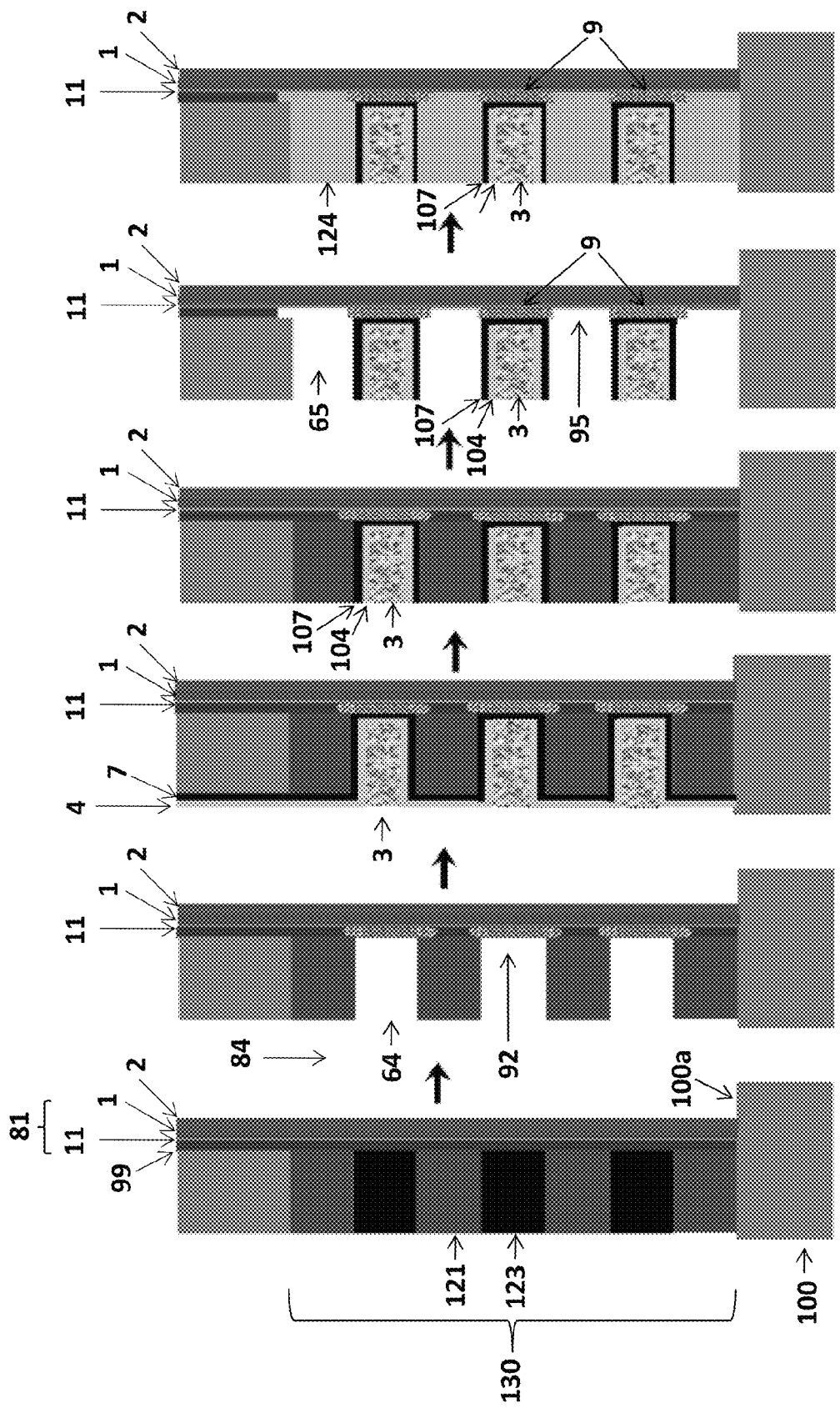

METHODS OF MAKING THREE DIMENSIONAL NAND DEVICES

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string including providing a first stack of alternating first material layers and second material layers over a major surface of a substrate. The first material layers include first silicon oxide layers, the second material layers include second silicon oxide layers, and the first silicon oxide layers have a different etch rate from the second silicon oxide when exposed to the same etching medium. The first stack includes a back side opening, a front side opening, and at least a portion of a floating gate layer, a tunnel dielectric and a semiconductor channel located in the front side opening. The method also includes selectively removing the first material layers through the back side opening to form back side control gate recesses between adjacent second material layers, forming a blocking dielectric in the back side control gate recesses through the back side opening and forming a plurality of control gate electrodes over the blocking dielectric in the back side control gate recesses through the back side opening.

Another embodiment relates to a method of making a monolithic three dimensional NAND string including forming a stack of alternating first material layers and second material layers over a substrate. The second material is different from the first material. The method also includes etching the stack to form a front side opening in the stack, forming a silicon floating gate layer in the front side opening, forming a tunnel dielectric over the silicon floating gate layer in the front side opening and forming a semiconductor channel layer over the tunnel dielectric in the front side opening. The method also includes etching the stack to form a back side opening in the stack, selectively removing the first material layers through the back side opening to form first back side recesses between the second material layers and to expose portions of the silicon floating gate layer in the first back side recesses, forming a metal layer in the first back side recesses in contact with the exposed portions of the silicon floating gate layer and reacting the metal layer with the exposed portions of the silicon floating gate to form discrete silicide floating gate segments. The method also includes forming a blocking dielectric in the first back side recesses through the back side opening, forming a plurality of control gate electrodes over the blocking dielectric in the first back side recesses through the back side opening, selectively removing the second material layers through the back side opening to form second back side recesses between adjacent control gate electrodes and to expose remaining silicon portions of the silicon floating gate layer in the second back side recesses, oxidizing or removing the exposed remaining silicon portions of the silicon floating gate layer and filling the second back side recesses through the back side opening with insulating material layers.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 5A-5F illustrate a method of making a NAND string according to an embodiment.

FIGS. 6A-6F illustrate a method of making a NAND string according to an embodiment.

FIGS. 7A-7F illustrate a method of making a NAND string according to an embodiment.

FIGS. 8A-8E illustrate a method of making a NAND string according to an embodiment.

FIGS. 9A-9E illustrate a method of making a NAND string according to an embodiment.

FIGS. 10A-10F illustrate a method of making a NAND string according to an embodiment.

DETAILED DESCRIPTION

Many conventional three dimensional NAND memories store charge in silicon nitride charge storage dielectric layers. The conventional devices suffer from slow erase times, less than desirable data retention and charge spreading. The inventors have realized that low work function conducting floating gates provide better performance than charge storage silicon nitride dielectric layers.

Conventional methods to fabricate floating gates in three dimensional NAND devices rely on forming <5 nm recesses in polysilicon from memory hole side. However, it is difficult to control the uniformity of the floating gate thicknesses in high aspect ratio structures. That is, conventional processes tend to produce devices in which the floating gate thicknesses vary from top to bottom in the NAND string.

The inventors have discovered that high aspect ratio NAND strings with uniform floating gate thicknesses can be fabricated with a combination of selective wet etching between different silicon dioxide films combined with selective oxidation/removal of polysilicon floating gate material from the back side to improve the ease of forming the floating gates. The methods of the embodiments of the invention take advantage of the highly selective etching that can be achieved between different silicon oxide materials, such as TEOS/HDP oxide and PSG/BPSG, described in more detail below.

The floating gates can be made of any material, (e.g. polysilicon, silicon-germanium or metal silicide) that can be oxidized to form an insulating material or can be selectively etched to oxide.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
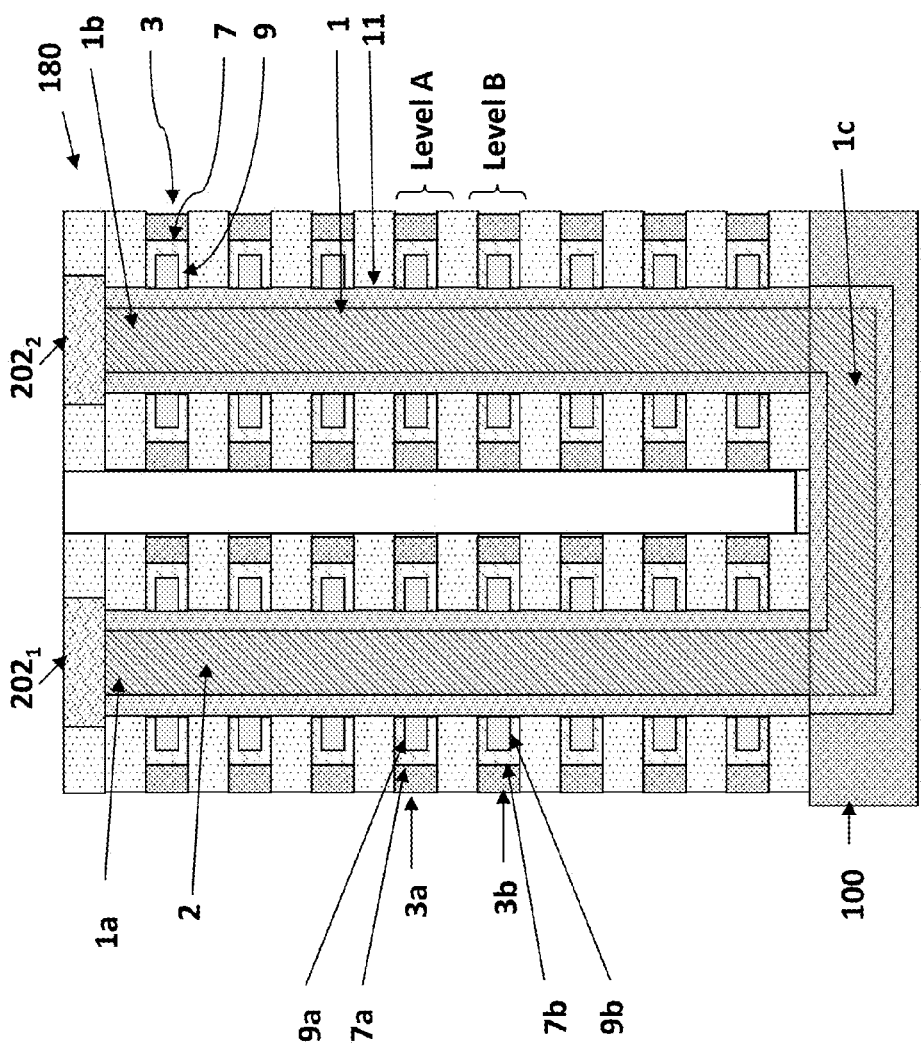
FIG. 3A is a side cross sectional view of a conventional NAND string of an embodiment with a U-shaped channel.
Figure 3B:
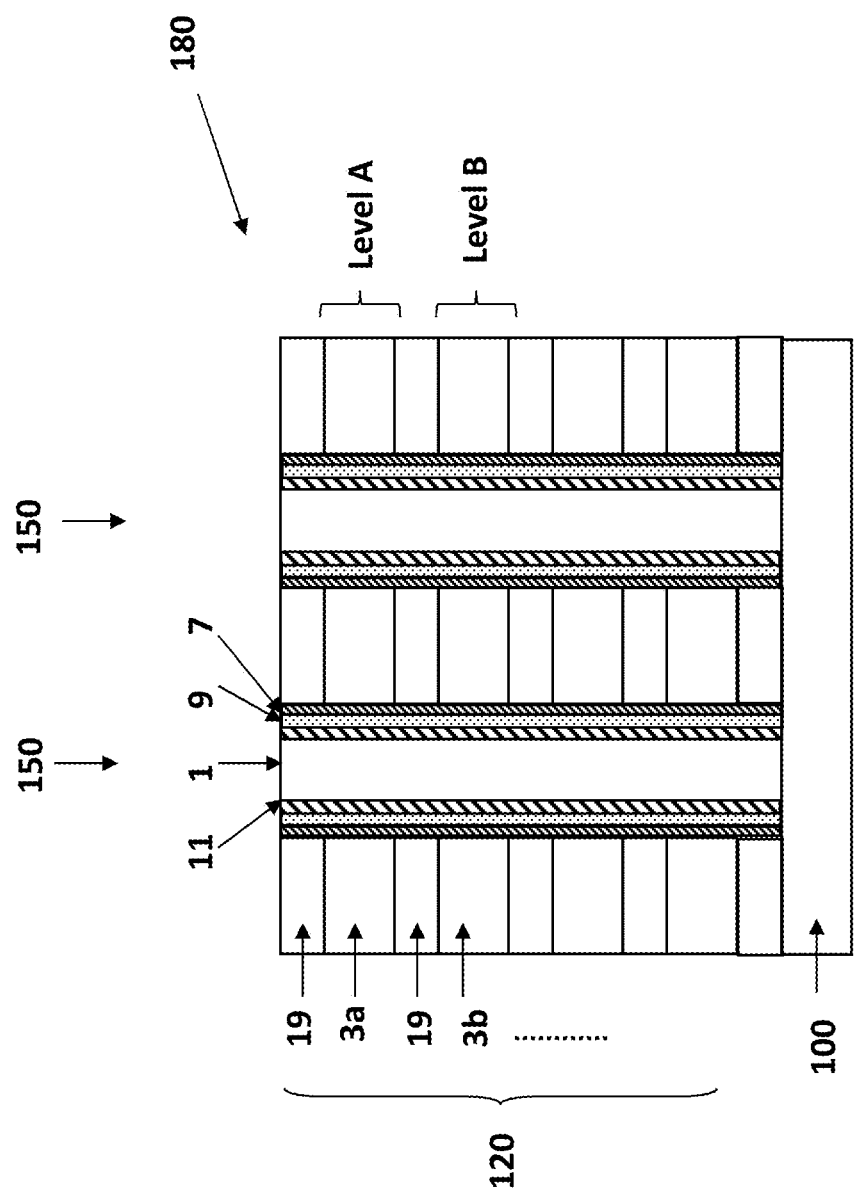
FIG. 3B is a side cross sectional view of another conventional NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate electrodes 3, as shown in FIGS. 1A, 2A and 3A. Alternatively, a straight blocking dielectric layer 7 may be located only adjacent to an edge (i.e., minor surface) of each control gate electrode 3, as shown in FIG. 3B. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising NAND strings 180. In this device, the front side openings (e.g. memory holes) 81 are circular, thereby resulting in cylindrical pillar shaped NAND strings 180. From the view, the tunnel dielectric 11, charge storage region 9 and blocking dielectric form concentric rings around the channel 1. The control gate electrode 3 in each device level is generally slab shaped. A back side opening 84, such as a trench, electrically separates adjacent NAND strings 180 from each other. As discussed in more detail below, the back side opening 84 may be used in the manufacture of NAND strings 180 according to some embodiments.

A first embodiment of making a monolithic three dimensional NAND string 180 is illustrated in FIGS. 5A-5F. As illustrated in FIG. 5A, a first stack 120 of alternating first material layers 121 and second material layers 122 is provided over a major surface 100a of a substrate 100. Preferably, the first material layers 121 comprise first silicon oxide layers and the second material layers 122 comprise second, different silicon oxide layers. Preferably, the first silicon oxide layers 121 have a different etch rate from the second silicon oxide layers 122 when exposed to the same etching medium. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides and borosilicate glass (BSG) or borophosphosilicate glass (BPSG). Selective etching of silicon oxide materials may be performed by chemical dry etching or wet etching techniques. Example silicon oxide combinations suitable for use with selective dry etching techniques are summarized in Table 1 below while combinations suitable for use with wet etching techniques are summarized in Table 2 below.

TABLE 1

|  | Etch Selectivity | Etching Method |
| --- | --- | --- |
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| Etch Selectivity (BPSG:TEOS) | Wet etch Method 99.7% Acetic acid:49% HF ratio |
| --- | --- |
| 27:1 | 200:1 |
| 42:1 | 100:1 |
| 55:1 | 50:1 |

As can be seen in Tables 1 and 2 above, the selectivity among the silicon oxide pairs may range from 5:1 to 230:1. Further, in the case of DCS:DS, the selectivity is tunable. That is, the selectivity between DCS and DS may be chosen based on the etching conditions, e.g. temperature, etchant composition, etc. In an embodiment, selectively removing the first material layers comprises selective etching using a $HF:H_2O$ in a 1:5-15 ratio or a $HF:C_2H_4O_2$ in a 1:40-60 ratio wet etch chemistry. Alternatively, the selective etching may comprise selective dry etching using any suitable dry etching system, such as the Frontier® CDE system from Applied Materials, Inc.

The various silicon oxides discussed above may be deposited by any suitable manner, such as low pressure chemical vapor deposition (LPCVD), plasma enhanced chemical vapor deposition (PECVD), chemical vapor deposition (CVD), and atmospheric pressure chemical vapor deposition (APCVD). Table 3 below summarizes the process parameters (i.e., reactor type, temperature, pressure, reactant gases and flow ratios) suitable for deposition of the above described silicon oxide materials.

TABLE 3

| Oxide Type | CVD Reactor Type | Temperature | Pressure | Reactant gases & flow ratio |
| --- | --- | --- | --- | --- |
| DCS Oxide | LPCVD | 700-900° C. | 125 mT-1 T | $DCS:N_2O$ = 0.25-1 |
| DS Oxide | PECVD | ~300° C. | 700 mT | $DS:N_2O$ = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, TEOS($SiH_4$) & $O_2$ |
| TEOS | PECVD | <450° C. | 2-10 T | $TEOS:O_2$ = 1:10-1:20 |
| BPSG | PECVD | 300-500° C. |  | $B_2H_6$, Phosphine & $SiH_4$ |
| BPSG | APCVD | 300-500° C. | 760 T | $B_2H_6$, Phosphine & $SiH_4$ |

In an embodiment illustrated in FIG. 5B, the first stack 120 comprises a back side opening 84 and a front side opening 81. The front side opening includes at least a portion of a floating gate layer 99, a tunnel dielectric 11 and a semiconductor channel 1 formed thereon. Optionally, an insulating fill material 2 may be provided to fill any remaining space in the front side opening 81 after forming the semiconductor channel 1. As also illustrated in FIG. 5B, the method includes selectively removing the first material (e.g., oxide) layers 121 through the back side opening 84 to form back side control gate recesses 64 between adjacent second material layers 122.

Then, as illustrated in FIG. 5C, a blocking dielectric 7 is formed through the back side opening 84 in the back side control gate recesses 64. Portions of the blocking dielectric 7 in each of the back side control gate recesses 64 have a clam shape 107 with a vertical portion 107c adjacent the discrete charge storage regions 9 and horizontal portions 107a, 107b adjacent the second material layers 122. A plurality of control gate electrodes 3 are formed in the opening of the clam shaped 107 portion of the blocking dielectric 7 in the back side control gate recesses 64 through the back side opening 84. The control gate electrode material may be removed from the back side opening 84 after deposition to leave the control gate electrode 3 in the back side control gate recesses 64. Optionally, a barrier/adhesion layer (e.g. a liner) 4 may be formed over the blocking dielectric 7 prior to forming the control gate electrodes 3. The barrier/adhesion layer 4 may be made of any suitable material such as TiN or WN.

As illustrated in FIG. 5D, the method further includes removing the blocking dielectric layer 7, and the optional barrier/adhesion layer 4 from the sides of the back side opening 84 after forming the control gate electrodes 3 to leave barrier layer segments 104 and clam shaped portions 107 of the blocking dielectric 7.

Next, as illustrated in FIG. 5E, the method includes selectively removing the second material (e.g. oxide) layers 122 through the back side opening 84 to form back side recesses 65 between adjacent control gate electrodes 3 and to expose portions of the floating gate layer 99 in the back side recesses 65. The method also includes oxidizing the exposed portions of the floating gate layer to form oxide regions 91 such that non-exposed portions of the floating gate layer 99 located adjacent to the control gate electrodes 3 form discrete charge storage (e.g. floating gate) segments 9. In an embodiment, the floating gate layer 99 is polysilicon and the oxide regions 91 are silicon oxide. Next as illustrated in FIG. 5F, the back side recesses 65 are filled through the back side opening 84 with insulating material layers 124, such as silicon oxide or nitride layers.

FIGS. 6A-6F illustrate another embodiment of making a monolithic three dimensional NAND string 180. As illustrated in FIG. 6A, a first stack 120 of alternating first material layers 121 and second material layers 122 is provided over a major surface 100a of a substrate 100. Preferably, as in the previous embodiment, the first material layers 121 comprise first silicon oxide layers and the second material layers 122 comprise second, different silicon oxide layers. Preferably, the first silicon oxide layers 121 have a different etch rate from the second silicon oxide layers 122 when exposed to the same etching medium.

As in the previous embodiment, the method includes forming the front side opening 81 in the first stack 120. Next, the method includes forming the floating gate layer 99, the tunnel dielectric 11 and the semiconductor channel 1 in the front side opening 81. As in the previous embodiment, an optional insulating fill material 2 may be formed in the front side opening 81. Then, the back side opening 84 is formed in the first stack 120.

The steps illustrated in FIGS. 6B-6D are the same as those illustrated in FIGS. 5B-5D of the previous embodiment. That is, the method includes selectively removing the first material layers 121 through the back side opening 84 to form back side control gate recesses 64 between adjacent second material layers 122. Then, as illustrated in FIG. 6C, a blocking dielectric 7 is formed in the back side control gate recesses 64 through the back side opening 84. Portions of the blocking dielectric 7 in each of the back side control gate recesses 64 have a clam shape 107 as in the previous embodiment. A plurality of control gate electrodes 3 are then formed in the opening of the clam shaped 107 portion of the blocking dielectric 7 through the back side opening 84 in the back side control gate recesses 64. Optionally, a barrier/adhesion layer 4 may be formed over the blocking dielectric 7 prior to forming the control gate electrodes 3. As illustrated in FIG. 6D, the method further includes removing the blocking dielectric layer 7, and the optional barrier/adhesion layer 4 from the sides of the back side opening 84 after forming the control gate electrodes 3 to leave blocking layer segments 104 and charge shaped portions 107 of the blocking dielectric 7.

Next, as illustrated in FIG. 6E, the method includes selectively removing the second material layers 122 through the back side opening 84 to form back side recesses 65 between adjacent control gate electrodes 3 and to expose portions of the floating gate layer 99 in the back side recesses 65. In contrast to the previous embodiment, the exposed portions of the floating gate layer 99 are removed rather than oxidized to form gaps 95 in the floating gate layer 99 such that remaining portions of the floating gate layer 99 located adjacent to the control gate electrodes 3 form discrete floating gate segments 9. The exposed portions of the floating gate layer 99 may be removed by selective etching. Next, as illustrated in FIG. 6F, the back side recesses 65 are filled through the back side opening 84 with insulating material layers 124.

FIGS. 7A-7F illustrate another embodiment of making a monolithic three dimensional NAND string 180 in which silicide floating gates are formed by silicidation of a silicon floating gate layer 99 through the back side control gate recesses 64. As illustrated in FIG. 7A, a first stack 120 of alternating first material (e.g., silicon oxide) layers 121 and second material (e.g., different silicon oxide) layers 122 is provided over a major surface 100a of a substrate 100. As illustrated in FIG. 7B, the first stack 120 comprises a back side opening 84 and a front side opening 81. A floating gate layer 99, a tunnel dielectric 11 and a semiconductor channel 1 are located in the front side opening 81. Optionally, an insulating fill material 2 may be provided to fill any remaining space in the front side opening 81 after forming the semiconductor channel 1.

As in the previous embodiments, the method includes selectively removing the first silicon oxide material layers 121 through the back side opening 84 to form back side control gate recesses 64 between adjacent second material layers 122, as illustrated in FIG. 7B. In this embodiment, the floating gate layer 99 comprises a polysilicon layer and the method further includes the step of reacting portions of the polysilicon floating gate layer 99 exposed in the back side control gate recesses 64 with a metal layer (not shown for clarity), such as Ti, W, Co, Ni, Pd or Pt deposited in the back side control gate recesses 64 to form discrete metal silicide charge storage regions 92. This step is performed prior to forming the blocking dielectric 7 in the back side control gate recesses 64. As discussed in more detail below, the metal silicide portions 92 of the floating gate layer 99 will be separated from each other to form discrete charge storage (e.g. floating gate) segments 9, such as Ti, W, Co, Ni, Pd or Pt silicide segments.

As illustrated in FIG. 7C, a blocking dielectric 7 is formed in the back side control gate recesses 64 through the back side opening 84 in contact with charge storage segments 9. As in the previous embodiments, portions of the blocking dielectric 7 in each of the back side control gate recesses 64 have a clam shape 107. A plurality of control gate electrodes 3 are then formed in the opening of the clam shaped 107 portion of the blocking dielectric 7 in the back side control gate recesses 64 through the back side opening 84. Optionally, a barrier/adhesion layer 4 may be formed over the blocking dielectric 7 prior to forming the control gate electrodes 3.

As illustrated in FIG. 7D, the method further includes removing the blocking dielectric layer 7 and the optional barrier/adhesion layer 4 from the sides of the back side opening 84 after forming the control gate electrodes 3 to leave respective clam shaped regions 104, 107. Next, as illustrated in FIG. 7E, the method includes selectively removing the second material layers 122 through the back side opening 84 to form back side recesses 65 between adjacent control gate electrodes 3 and to expose the remaining polysilicon portions of the floating gate layer 99 in the back side recesses 65. The exposed remaining polysilicon portions of the floating gate layer 99 are removed by selective etching to form gaps 95 in the floating gate layer 99 such that remaining silicide portions of the floating gate layer 99 located adjacent to the control gate electrodes 3 form discrete floating gate segments 9. Next, as illustrated in FIG. 7F, the back side recesses 65 are filled through the back side opening 84 with insulating material layers 124.

FIGS. 8A-8E illustrate another embodiment of making a monolithic three dimensional NAND string 180. In this embodiment, the method begins by first providing a second stack 130 of alternating first sacrificial material layers 123 and the first material layers 121 over the major surface 100a of the substrate 100 as illustrated in FIG. 8A. Thus, the order of forming recesses 64 and 65 is reversed in this embodiment compared to the prior embodiments. Preferably, the first material layers 121 comprise first silicon oxide layers and the first sacrificial material layers 123 comprise a different material than silicon oxide, such as silicon nitride or polysilicon. Preferably, the first silicon oxide layers 121 have a different etch rate from the first sacrificial material layers 123 when exposed to the same etching medium.

Next, similar to the previous embodiments, the method includes forming the front side opening 81 and then forming the floating gate layer 99, the tunnel dielectric 11 and the semiconductor channel 1 in the front side opening 81. As in the previous embodiments, an optional insulating fill material 2 may be formed in the front side opening 81. Then, the back side opening 84 is formed in the second stack 130.

Next, as illustrated in FIG. 8B, the first sacrificial material layers 123 are selectively removed to form back side recesses 65 between adjacent first material layers 121 and to expose portions of the floating gate layer 99 in the back side recesses 65. The method also includes oxidizing the exposed portions of the floating gate layer to form oxide (e.g. silicon oxide) regions 91 such that non-exposed portions of the floating gate layer 99 located adjacent to the control gate electrodes 3 form discrete charge storage (e.g. floating gate) segments 9, as discussed in more detail below. As illustrated in FIG. 8C, the method also includes a step of filling the back side recesses 65 through the back side opening 84 with the second material layers 122 to form the first stack 120 of first material layers 121 and second material layers 122. Preferably, the second material layers 122 comprise silicon oxide layers having a different etch rate from the first oxide layers 121 when exposed to the same etching medium.

Next, as illustrated in FIG. 8D, the method includes selectively removing the first material layers 121 through the back side opening 84 to form back side control gate recesses 64 between adjacent second material layers 122 and exposing the discrete charge storage segments 9 in the back side control gate recesses 64. Next, as illustrated in FIG. 8E, a blocking dielectric 7 is formed in the back side opening 84 and in the back side control gate recesses 64. Similar to the previous embodiments, the blocking dielectric 7 includes a clam shape 107 in the back side control gate recesses 64. Control gate electrodes 3 are formed in the clam shaped portion 107 of the blocking dielectric 7 in the back side control gate recesses 64.

FIGS. 9A-9E illustrate another embodiment of making a monolithic three dimensional NAND string 180. This embodiment is similar to the previous embodiment, except that this embodiment includes gaps 95 rather than oxide regions 91 in the floating gate layer 99. Similar to the previous embodiment, the method begins by first providing a second stack 130 of alternating first sacrificial material layers 123 and the first material layers 121 over the major surface 100a of the substrate 100 as illustrated in FIG. 9A. Preferably, the first material layers 121 comprise first silicon oxide layers and the first sacrificial material layers 123 comprise a different material than silicon oxide, such as silicon nitride or polysilicon.

Next, similar to the previous embodiments, the method includes forming the front side opening 81 and then forming the floating gate layer 99, the tunnel dielectric 11 and the semiconductor channel 1 in the front side opening 81. As in the previous embodiments, an optional insulating fill material 2 may also be formed in the front side opening 81. Then, the back side opening 84 is formed in the second stack 130.

Then, as illustrated in FIG. 9B, the first sacrificial material layers 123 are selectively removed to form back side recesses 65 between adjacent first material layers 121 and to expose portions of the floating gate layer 99 in the back side recesses 65. In contrast the previous embodiment, the exposed portions of the floating gate layer 99 are removed rather than oxidized to form gaps 95 in the floating gate layer 99 such that remaining portions of the floating gate layer 99 located adjacent to the control gate electrodes 3 form discrete floating gate segments 9. As illustrated in FIG. 9C, the method also includes a step of filling the back side recesses 65 through the back side opening 84 with the second material layers 122 to form the first stack 120 of first material layers 121 and second material layers 122. Preferably, the second material layers 122 comprise silicon oxide layers having a different etch rate from the first oxide layers 121 when exposed to the same etching medium.

Next, as illustrated in FIG. 9D, the method includes selectively removing the first material layers 121 through the back side opening 84 to form back side control gate recesses 64 between adjacent second material layers 122 and exposing the discrete charge storage segments 9 in the back side control gate recesses 64. Next, as illustrated in FIG. 9E, a blocking dielectric 7 is formed in the back side opening 84 and in the back side control gate recesses 64. Similar to the previous embodiments, the blocking dielectric 7 includes a clam shape 107 in the back side recesses 65. Control electrodes 3 are formed in the clam shaped portion 107 of the blocking dielectric 7 in the back side control gate recesses 64.

FIGS. 10A-10F illustrate another embodiment of making a monolithic three dimensional NAND string 180. This embodiment is similar to the previous two embodiments, except that silicide floating gates 92 are formed instead of oxide regions 91. Similar to the previous embodiment, the method begins by first providing a second stack 130 of alternating first sacrificial material layers 123 and the first material layers 121 over the major surface 100a of the substrate 100 as illustrated in FIG. 10A. Preferably, the first material layers 121 comprise first silicon oxide layers and the first sacrificial material layers 123 comprise a different material than silicon oxide, such as silicon nitride or polysilicon.

Next, similar to the previous embodiments, the method includes forming the front side opening 81 and then forming the floating gate layer 99, the tunnel dielectric 11 and the semiconductor channel 1 in the front side opening 81. As in the previous embodiments, an optional insulating fill material 2 may be formed in the front side opening 81. Then, the back side opening 84 is formed in the second stack 130.

Then, as illustrated in FIG. 10B, the first sacrificial material layers 123 are selectively removed to form back side recesses 65 between adjacent first material layers 121 and to expose portions of the floating gate layer 99 in the back side control gate recesses 64. In this embodiment, the floating gate layer 99 comprises a polysilicon layer and the method further includes the step of reacting portions of the polysilicon floating gate layer 99 exposed in the back side control gate recesses 64 with a metal, such as Ti, W, etc. to form discrete metal silicide regions 92 similar to the step described with respect to FIG. 7B above. This step is performed prior to forming the blocking dielectric 7 in the back side control gate recesses 64. As in the embodiment illustrated in FIGS. 7A-7F above, the metal silicide portions 92 of the floating gate layer 99 are separated from each other to form discrete floating gate segments 9.

As illustrated in FIG. 10C, a blocking dielectric 7 is then formed through the back side opening 84 in the back side control gate recesses 64. As in the previous embodiments, portions of the blocking dielectric 7 in each of the back side control gate recesses 64 have a clam shape 107. A plurality of control gate electrodes 3 are then formed in the opening of the clam shaped 107 portion of the blocking dielectric 7 in the back side control gate recesses 64 through the back side opening 84. Optionally, a barrier/adhesion layer 4 may be formed over the blocking dielectric 7 prior to forming the control gate electrodes 3.

As illustrated in FIG. 10D, the method further includes removing the blocking dielectric layer 7, and the optional barrier/adhesion layer 4 from the sides of the back side opening 84 after forming the control gate electrodes 3 to form respective clam shaped portions 104, 107. Next, as illustrated in FIG. 10E, the method includes selectively removing the first material layers 121 through the back side opening 84 to form back side recesses 65 between adjacent control gate electrodes 3 and to expose remaining polysilicon portions of the floating gate layer 99 in the back side recesses 65. The exposed remaining polysilicon portions of the floating gate layer 99 are removed to form gaps 95 in the floating gate layer 99 such that remaining silicide portions of the floating gate layer 99 located adjacent to the control gate electrodes 3 form discrete floating gate segments 9. Next, as illustrated in FIG. 10F, the back side recesses 65 are filled through the back side opening 84 with insulating material layers 124.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
   providing a first stack of alternating first material layers and second material layers over a major surface of a substrate, wherein:
      the first material layers comprise first silicon oxide layers, the second material layers comprise second silicon oxide layers, and the first silicon oxide layers have a different etch rate from the second silicon oxide layers when exposed to the same etching medium; and
      the first stack comprises a back side opening, a front side opening, and at least a portion of a floating gate layer, a tunnel dielectric and a semiconductor channel located in the front side opening;
   selectively removing the first material layers through the back side opening to form back side control gate recesses between adjacent second material layers;
   forming a blocking dielectric in the back side control gate recesses through the back side opening; and
   forming a plurality of control gate electrodes over the blocking dielectric in the back side control gate recesses through the back side opening.

2. The method of claim 1, wherein providing the first stack comprises:
   providing a second stack of alternating first sacrificial material layers and the first material layers over the major surface of the substrate;
   forming the front side opening in the first stack;
   forming the floating gate layer, the tunnel dielectric and the semiconductor channel in the front side opening;
   forming the back side opening in the second stack;
   selectively removing the first sacrificial material layers to form first back side recesses between adjacent first material layers and to expose portions of the floating gate layer in the first back side recesses;
   oxidizing or removing the exposed portions of the floating gate layer such that remaining portions of the floating gate layer located adjacent to the first material layers to form discrete floating gate segments; and
   filling the first back side recesses through the back side opening with the second material layers to form the first stack.

3. The method of claim 2, wherein the first sacrificial material layers comprise silicon nitride layers.

4. The method of claim 2, wherein the floating gate layer comprises a polysilicon floating gate layer, and the step of oxidizing or removing the exposed portions of the floating gate layer comprises oxidizing the exposed portions of the polysilicon floating gate layer to form silicon oxide regions between the discrete floating gate segments.

5. The method of claim 2, wherein the floating gate layer comprises a polysilicon, metal, metal nitride or metal silicide floating gate layer, and the step of oxidizing or removing the exposed portions of the floating gate layer comprises removing the exposed portions of the floating gate layer to form void regions between the discrete floating gate segments.

6. The method of claim 5, wherein the step of filling the first back side recesses through the back side opening with the second material layers further fills the respective void regions with the respective second material layers.

7. The method of claim 1, wherein providing the first stack comprises:
   depositing the alternating first material layers and second material layers over the major surface of the substrate;
   forming the front side opening in the first stack;
   forming the floating gate layer, the tunnel dielectric and the semiconductor channel in the front side opening; and
   forming the back side opening in the first stack.

8. The method of claim 7, further comprising:
   selectively removing the second material layers through the back side opening to form second back side recesses between adjacent control gate electrodes and to expose portions of the floating gate layer in the second back side recesses;
   oxidizing or removing the exposed portions of the floating gate layer such that remaining portions of the floating gate layer located adjacent to the control gate electrodes to form discrete floating gate segments; and filling the second back side recesses through the back side opening with insulating material layers.

9. The method of claim 8, further comprising:
depositing a liner over the blocking dielectric in the back side control gate recesses prior to forming the plurality of control gate electrodes; and
removing the blocking dielectric and the liner from the back side opening thereby exposing a surface of the second material layers in the back side opening.

10. The method of claim 9, wherein the liner comprises WN or TiN and the control gate electrodes comprise W.

11. The method of claim 8, wherein the floating gate layer comprises a polysilicon floating gate layer, and the step of oxidizing or removing the exposed portions of the floating gate layer comprises oxidizing the exposed portions of the polysilicon floating gate layer to form silicon oxide regions between the discrete floating gate segments.

12. The method of claim 8, wherein the floating gate layer comprises a polysilicon, metal, metal nitride or metal silicide floating gate layer, and the step of oxidizing or removing the exposed portions of the floating gate layer comprises removing the exposed portions of the floating gate layer to form void regions between the discrete floating gate segments.

13. The method of claim 12, wherein the step of filling the second back side recesses through the back side opening with the insulating material layers further fills the respective void regions with the respective insulating material layers.

14. The method of claim 1, wherein the floating gate layer comprises a polysilicon layer, and further comprising siliciding portions of the polysilicon floating gate layer exposed in the back side control gate recesses prior to forming the blocking dielectric in the back side control gate recesses.

15. The method of claim 1, wherein the blocking dielectric comprises a plurality of clam shaped regions inside the back side control gate recesses, and the plurality of control gate electrodes are located in the plurality of claim shaped regions in the blocking dielectric.

16. The method of claim 1, wherein the first silicon oxide layers are deposited by CVD using a dichlorosilane ($H_2SiCl_2$) source, and the second silicon oxide layers are deposited by CVD using a disilane ($Si_2F_6$) source.

17. The method of claim 1, wherein the first silicon oxide layers are deposited by High Aspect Ratio Process (HARP) non-plasma based CVD using TEOS and ozone sources, and the second silicon oxide layers are deposited by high density plasma (HDP) CVD.

18. The method of claim 1, wherein the first silicon oxide layers comprise borosilicate glass or borophosphosilicate glass layers, and the second silicon oxide layers deposited from a TEOS source.

19. The method of claim 1, wherein:
the substrate comprises a silicon substrate;
the monolithic three dimensional NAND string is located in an array of monolithic three dimensional NAND strings over the silicon substrate;
at least one memory cell in a first device level of the three dimensional array of NAND strings is located over another memory cell in a second device level of the three dimensional array of NAND strings; and
the silicon substrate contains an integrated circuit comprising a driver circuit for the memory device located thereon.

20. The method of claim 1, wherein selectively removing the first material layers comprises selective etching using a $HF:H_2O$ in a 1:5-15 ratio or a $HF:C_2H_4O_2$ in a 1:40-60 ratio wet etch chemistry.

21. A method of making a monolithic three dimensional NAND string, comprising:
forming a stack of alternating first material layers and second material layers over a substrate, wherein the second material is different from the first material;
etching the stack to form a front side opening in the stack;
forming a silicon floating gate layer in the front side opening;
forming a tunnel dielectric over the silicon floating gate layer in the front side opening; and
forming a semiconductor channel layer over the tunnel dielectric in the front side opening;
etching the stack to form a back side opening in the stack;
selectively removing the first material layers through the back side opening to form first back side recesses between the second material layers and to expose portions of the silicon floating gate layer in the first back side recesses;
forming a metal layer in the first back side recesses in contact with the exposed portions of the silicon floating gate layer;
reacting the metal layer with the exposed portions of the silicon floating gate to form discrete silicide floating gate segments;
forming a blocking dielectric in the first back side recesses through the back side opening;
forming a plurality of control gate electrodes over the blocking dielectric in the first back side recesses through the back side opening;
selectively removing the second material layers through the back side opening to form second back side recesses between adjacent control gate electrodes and to expose remaining silicon portions of the silicon floating gate layer in the second back side recesses;
oxidizing or removing the exposed remaining silicon portions of the silicon floating gate layer; and
filling the second back side recesses through the back side opening with insulating material layers.

22. The method of claim 21, further comprising:
depositing a liner over the blocking dielectric in the back side recesses prior to forming the plurality of control gate electrodes; and
removing the blocking dielectric and the liner from the back side opening thereby exposing a surface of the second material layers in the back side opening.

23. The method of claim 22, wherein the silicon floating gate layer comprises a polysilicon floating gate layer, the metal layer comprises a Ti, W, Co, Ni, Pd or Pt layer, the liner comprises WN or TiN, and the control gate electrodes comprise W.

24. The method of claim 21, wherein:
the substrate comprises a silicon substrate;
the monolithic three dimensional NAND string is located in an array of monolithic three dimensional NAND strings over the silicon substrate;
at least one memory cell in a first device level of the three dimensional array of NAND strings is located over another memory cell in a second device level of the three dimensional array of NAND strings; and
the silicon substrate contains an integrated circuit comprising a driver circuit for the memory device located thereon.

* * * * *